(12) United States Patent
Faure et al.

(10) Patent No.: US 9,535,198 B2
(45) Date of Patent: Jan. 3, 2017

(54) MIRROR COMPRISING A SILVERING-MODIFYING LAYER

(71) Applicant: SAINT-GOBAIN GLASS FRANCE, Courbevoie (FR)

(72) Inventors: Regine Faure, Paris (FR); Vincent Rachet, Montrouge (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 22 days.

(21) Appl. No.: 14/351,023

(22) PCT Filed: Oct. 11, 2012

(86) PCT No.: PCT/FR2012/052306
§ 371 (c)(1),
(2) Date: Apr. 10, 2014

(87) PCT Pub. No.: WO2013/054045
PCT Pub. Date: Apr. 18, 2013

(65) Prior Publication Data
US 2014/0254037 A1   Sep. 11, 2014

(30) Foreign Application Priority Data
Oct. 12, 2011 (FR) ...................................... 11 59214

(51) Int. Cl.
*G02B 5/26* (2006.01)
*C23C 18/31* (2006.01)
(Continued)

(52) U.S. Cl.
CPC ........... *G02B 5/26* (2013.01); *B29D 11/00596* (2013.01); *C03C 15/00* (2013.01); *C03C 17/36* (2013.01);
(Continued)

(58) Field of Classification Search
CPC ........... G02B 5/26; C23C 16/06; C23C 18/31; C23C 17/36; C23C 17/3618
(Continued)

(56) References Cited

U.S. PATENT DOCUMENTS 1,604,459 A * 10/1926 Lyons .......................... 428/201
2,774,745 A * 12/1956 Hedlund .............. C09D 101/18
106/169.17
(Continued)

FOREIGN PATENT DOCUMENTS

EP  0 404 463  12/1990
GB  652 858   5/1951
(Continued)

OTHER PUBLICATIONS

International Search Report as issued for International Application No. PCT/FR2012/052306, dated Jan. 24, 2013.

*Primary Examiner* — Zachary Wilkes
*Assistant Examiner* — George G King
(74) *Attorney, Agent, or Firm* — Pillsbury Winthrop Shaw Pittman LLP

(57) ABSTRACT

A colored mirror includes a transparent substrate and a reflective layer, including a coloring layer between the substrate and the reflective layer, the coloring layer including a matrix and a colorant. Furthermore, a process for preparing a mirror including a transparent substrate and a reflective layer, a coloring layer between the substrate and the reflective layer, the coloring layer including a matrix and a colorant, includes the production of the coloring layer on the substrate then the deposition of the reflective layer on the coloring layer.

14 Claims, 1 Drawing Sheet

(51) Int. Cl.
*C23C 16/06* (2006.01)
*B29D 11/00* (2006.01)
*G02B 5/08* (2006.01)
*C03C 15/00* (2006.01)
*C03C 17/36* (2006.01)
*C03C 19/00* (2006.01)

(52) U.S. Cl.
CPC ....... *C03C 17/3618* (2013.01); *C03C 17/3636* (2013.01); *C03C 19/00* (2013.01); *C23C 16/06* (2013.01); *C23C 18/31* (2013.01); *G02B 5/0816* (2013.01); *C03C 2218/31* (2013.01)

(58) Field of Classification Search
USPC .......................................................... 359/884
See application file for complete search history.

(56) References Cited

U.S. PATENT DOCUMENTS

| | | | |
|---|---|---|---|
| 3,445,216 A | | 5/1969 | Keefer et al. |
| 4,263,051 A * | | 4/1981 | Crawford ............... B82Y 30/00 |
| | | | 106/169.17 |
| 4,546,019 A * | | 10/1985 | Schneider ........................ 428/13 |
| 6,632,852 B1 * | | 10/2003 | Chen ........................ C08J 3/091 |
| | | | 522/120 |
| 2003/0035972 A1* | | 2/2003 | Hanson et al. ............... 428/480 |
| 2007/0031683 A1* | | 2/2007 | Morohashi et al. .......... 428/432 |
| 2011/0141596 A1 | | 6/2011 | Wang |

FOREIGN PATENT DOCUMENTS

| JP | 2006-151203 | 6/2006 |
|---|---|---|
| WO | WO 2004/078664 | 9/2004 |

\* cited by examiner

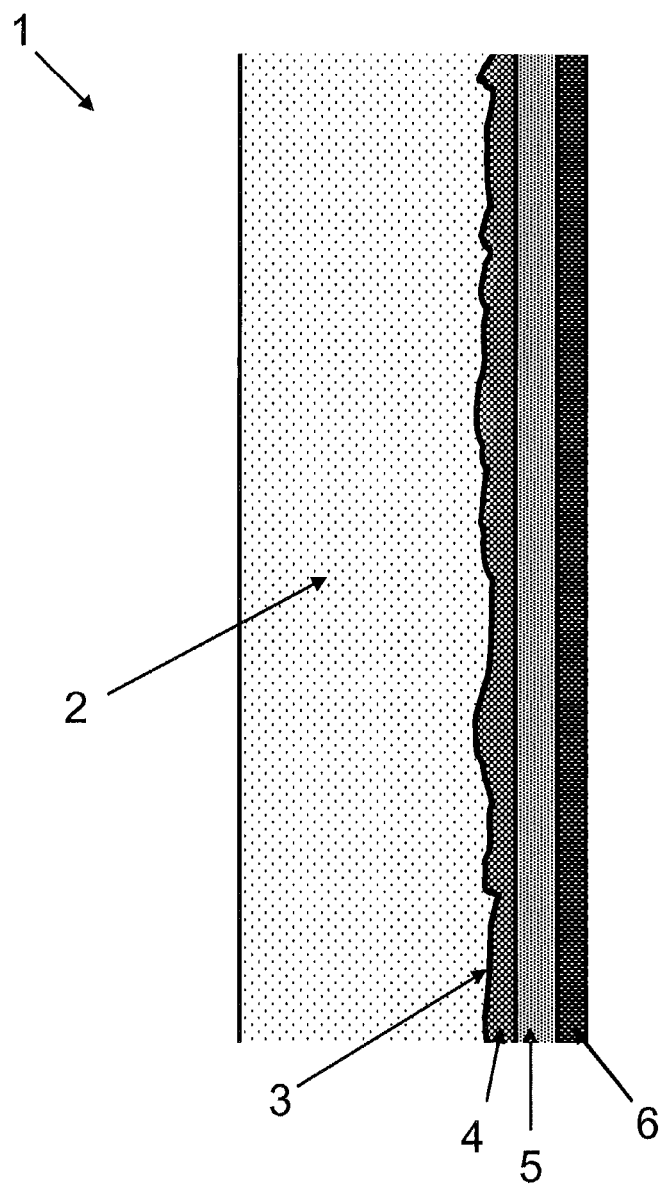

MIRROR COMPRISING A SILVERING-MODIFYING LAYER

CROSS-REFERENCE TO RELATED APPLICATIONS

This application is the U.S. National Stage of PCT/FR2012/052306, filed Oct. 11, 2012, which in turn claims priority to French Application No. 1159214, filed Oct. 12, 2011. The content of both applications are incorporated herein by reference in their entirety.

The invention relates to the field of mirrors. According to the invention, a layer known as a "silvering-modifying" layer (also known as a "coloring layer") is placed between the transparent substrate of the mirror and the reflective layer in order to modify the reflected image.

The very widespread silvered mirrors have a light reflection that is extremely high and greatly independent of the wavelength in the visible range. Therefore, these mirrors are almost perfect reflectors and have a silvering (color of the mirror) that is very neutral and not very "warm". The difficulty in modifying the reflection spectrum of the silver itself does not, today, make it possible to propose mirrors with different "silverings". According to the prior art, the adjustment of the color is only possible using a bulk-tinted glass. The use of colored glass poses however various problems:
high costs;
low availability;
not very subtle optical effect (especially without a texturing effect);
impossibility of rediscovering very old silverings such as for example the silvering linked to the use of mercury (Hall of Mirrors at Versailles).

U.S. Pat. No. 3,445,216 and WO 2004/078664 teach the coloration of a glass in its bulk by adding a colorant to the molten glass before the forming thereof. This colorant is generally of the oxide type. By proceeding in this way, a lot of colorant is consumed.

GB 652858 teaches a colored mirror comprising a stack of various monolithic and non-coloring thin layers individually between the transparent substrate of the mirror and the reflective layer. These layers may be of the metal or oxide or fluoride type and the coloration is the result of interferences between the various layers.

Another way of producing a modification of the image of a mirror has now been discovered by depositing, between the transparent substrate of the mirror and the reflective layer, a "silvering-modifying" layer (coloring layer) comprising a matrix and an organic colorant that is inserted into the matrix in the molecular state. The silvering-modifying layer is generally at least partially transparent in the visible.

The invention relates firstly to a colored mirror comprising a transparent substrate and a reflective layer, a coloring layer being found between said substrate and said reflective layer, said coloring layer comprising a matrix and an organic colorant that is inserted into the matrix in the molecular state.

The matrix may be organic or inorganic or hybrid. As an organic matrix, mention may be made of polymers such as polyepoxides, polyamides, polyacrylic acids, polyacrylates, polyacrylonitriles and polyvinyl chlorides. As an inorganic matrix, mention may be made of the oxides, nitrides, oxynitrides, carbides and oxycarbides of the following elements: Hf, V, Nb, Cr, Mo, W, Mn, Fe, Zn, Sn, Ta, As, Sb, In, Si, Ti, Zr and Al, and more particularly silica or zirconium oxide or titanium oxide. An inorganic or hybrid matrix may be produced via a sol-gel route, especially by hydrolysis/condensation of compounds of alkoxide type. In practice, the coloring layer may be produced by spraying a liquid comprising an organometallic compound comprising condensable groups (especially of alkoxide type) and a colorant. Depending on the precursor compounds used, the hybrid matrix may have a more or less organic or inorganic nature. An inorganic matrix may especially be produced via a sol-gel route and it is in this case generally amorphous. For a person skilled in the art, a hybrid compound is an organometallic compound, which combines organic parts (hydrocarbon-based groups such as alkyl, aryl, etc.) and inorganic parts such as Si—O—Si, Zr—O—Zr, etc. linkages, the organic and inorganic parts generally being bound to one another by covalent bonds. As a hybrid matrix, mention may be made of all the materials resulting from a hydrolysis/condensation of organosilanes R—Si(OR')$_3$ with R and R' being aryl or alkyl groups, it being possible for R to bear a polymerizable function such as methacryloxypropyltrimethoxysilane or 3-glycidyloxypropyltrimethoxysilane. An inorganic or hybrid matrix produced via a sol-gel route may comprise silica or zirconia or titanium oxide.

The colorant is organic and is present in molecular form in the matrix by forming a solid solution with the matrix. The colorant is therefore dissolved and is not in the form of particles. Its presence gives rise to a coloration of the colored layer in a manner visible to the naked eye compared to the same layer without the colorant, for an observer viewing their reflection in the mirror. The use of a dissolved organic colorant advantageously makes it possible to increase the transparency and limit the zones of haze that may be observed when the colorant is in the form of particles.

As organic colorant that is inserted into the matrix in the molecular state (and not in the form of particles), mention may be made of the following compounds:

| Supplier | Colorant | Color | Chemical nature |
|---|---|---|---|
| BASF | Basantol 311 | red | Cr/azo 1:2 in solution |
| | Basantol 099 | yellow | Quinophthalone in solution |
| | Neozapon 975 | green | Copper phthalocyanine + Cr/azo 1:1 |
| Ciba-Geigy | Irgaperse | red | Cr/azo 1:2 in solution |
| | Irgaperse 1641 | blue | Anthraquinone in solution |
| | Orasol G | red | Co/azo 1:2 in solution |
| | Orasol GN | blue | Phthalocyanine |

Mention may also be made of the following molecules:

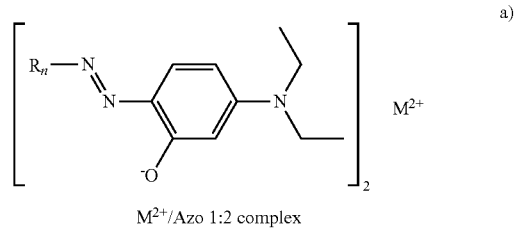

a)

$M^{2+}$/Azo 1:2 complex

-continued

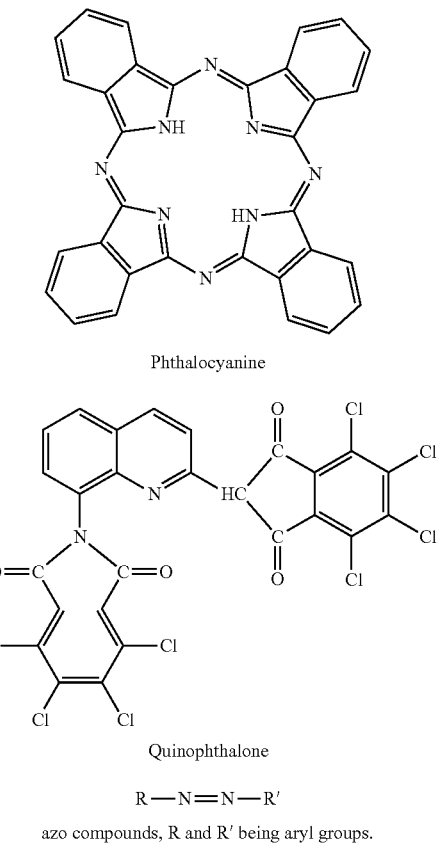

b) Phthalocyanine c) Quinophthalone d) R—N=N—R' azo compounds, R and R' being aryl groups.

Effects that are very diverse as far as the coloration is concerned can be obtained on the reflected image given the very large number of combinations possible between the various types of matrix and the various colorants. The possibility of mixing several different colorants especially enables a wide range of possible colors to be obtained.

In addition to the colorant according to the invention, a fluorophore compound, a photochromic compound, a thermochromic compound, etc., may be added to the matrix in order to obtain a supplementary optical effect.

The layer according to the invention may especially be a colored polymer film that is bonded to the substrate. In this case, the reflective metal layer may be produced on the film before or after it is bonded to the substrate.

The silvering-modifying layer is transparent enough so that at least a portion of the light in the visible range passes through it to reach the reflective layer, is reflected by this reflective layer and passes through it again in the opposite direction. The silvering-modifying layer is thin enough so that the light can pass through it at least partially in the visible range.

The silvering-modifying layer according to the invention may be the only layer positioned between the substrate and the reflective layer. However, the silvering-modifying layer according to the invention may also consist of several layers.

In addition to the coloration provided by the colorant, a texturing effect may be provided. This texturing may be imparted to the colored layer itself or produced on the substrate before deposition of the colored layer. In particular, the coloring layer may be embossed in order to impart the desired texture.

In particular, the silvering-modifying layer according to the invention may be porous in order to give a speckled effect. The silvering-modifying layer according to the invention may be structured in order to result in original properties of non-specular diffusion of the light such as a diffraction grating enabling the white light to be broken down into various colors of the visible spectrum (iridescence or rainbow effect) as a function of the angle of observation. Such a grating may be obtained by embossing a sol-gel layer before the solidification thereof. The embossing makes it possible to obtain any other type of texturing, especially the brushed metal appearance that introduces a multiplicity of parallel scratches.

The texturing effect may originate from a treatment of the substrate before deposition of the colored layer. In particular, this treatment may be a sandblasting or an acid attack giving rise to a surface unevenness. Such a treatment provides a diffusing effect that may range up to matt rendering.

The thickness of the silvering-modifying layer is generally between 50 nm and 100 µm. If its matrix is inorganic, it generally has a thickness between 50 nm and 500 nm. If its matrix is organic, it generally has a thickness between 50 nm and 100 µm, preferably between 1 µm and 100 µm. If its matrix is hybrid, it generally has a thickness between 50 nm and 50 µm, preferably between 100 nm and 50 µm.

The colorant is present in the silvering-modifying layer in a proportion of at most 60% by weight. It is generally present in a proportion of more than 0.1% by weight. This amount may depend on the matrix and on the optional solvent of the solution used for the deposition. By way of example, it is difficult to introduce more than 45% by weight of organic colorant into a layer with a zirconia matrix. As another example, it is difficult to introduce more than 14% by weight of organic colorant into a silica matrix synthesized by hydrolysis/condensation of MTEOS. The amount of colorant in the layer determines the intensity of the color.

Depending on the type of matrix used, it is possible to dissolve the organic colorant in a solvent, before mixing it with the matrix.

The silvering-modifying layer according to the invention is thick enough to modify, for the naked eye, the color and optionally the visible texture of the mirror, compared to the same mirror but free of the layer according to the invention.

The reflective layer may be produced on the coloring layer according to the methods known to a person skilled in the art. This reflective layer is generally metallic, for instance made of silver or aluminum. The reflective metal may be deposited in the vapor phase (CVD, PVD, magnetron sputtering) or via a wet route. A tie layer may be produced on the substrate (sheet of glass or support) before the deposition of the reflective metal. In the case of a deposition of the reflective metal by magnetron sputtering, a tie layer (also known as a primer layer) made of Ni—Cr is generally deposited beforehand. In the case of a deposition of silver via a wet route, before the deposition of silver, the surface is generally prepared in this way:

sensitization using a solution of stannous chloride, then
activation using a solution of palladium chloride $PdCl_2$.

The deposition of a silver layer is preferred as silver reflects the light better than aluminium.

These techniques for producing the reflective layer are not described in greater detail since they are well known to a person skilled in the art. The reflective layer may have a thickness between 50 and 200 nm.

Applied next to the reflective layer, especially silver layer, is at least one protective layer according to known methods. This protective coating may comprise a layer of copper and/or one or more layers of paint. It may be one or more layers of paint of the alkyd or PU or acrylic type. Here, the knowledge of a person skilled in the art is called for in order to apply the protective coatings of the reflective layers. It may be an inorganic layer deposited by magnetron sputtering. The latter process is particularly advantageous if the reflective layer is deposited by magnetron sputtering since then the latter layer and its protective layer may be deposited one after the other by successive passage under the corresponding targets. These processes for applying a protective layer may involve slight heating (below 180° C.), which is compatible with the use of organic compounds as constituents of the silvering-modifying layer according to the invention.

The invention also relates to a process for preparing the mirror according to the invention, said mirror comprising a transparent substrate and a reflective layer, a coloring layer being located between said substrate and said reflective layer, said coloring layer comprising a matrix and an organic colorant in molecular form, said process comprising the production of the coloring layer on the substrate then the deposition of the reflective layer on the coloring layer. It is possible to carry out a tempering treatment before application of the coloring layer according to the invention. The tempering treatment produces a hardening of the glass substrate and gives it a particular fracture behavior. The tempering treatment involves heating at more than 500° C. followed by a rapid cooling, generally using air. These tempering treatments applied to glass substrates are well known to a person skilled in the art.

FIG. 1 represents the mirror 1 in cross section according to the invention. It comprises a glass substrate 2, one face 3 of which has firstly undergone a texturing via sandblasting or acid attack. The silvering-modifying layer 4 according to the invention has been deposited on the textured face 3. A reflective layer 5 has then been deposited on the coloring layer 4. Finally, a protective coating 6 for protecting the reflective layer 5 has been deposited on the latter. The various elements of FIG. 1 are not to scale.

In the examples that follow, use is made of the compounds listed in the table below, sometimes cited using their common name:

| Common name | Scientific name | CAS No. | Possible supplier |
|---|---|---|---|
| Dowanol | 2-(2-ethoxyethoxy)ethanol | 111-90-0 | Merck |
| Klucel | hydroxypropyl cellulose | 9004-64-2 | |
| TEOS | tetraethoxysilane | 78-10-4 | Merck |
| MTEOS | methyltriethoxysilane | 2031-37-6 | |
| DIAMO | N-[3-(trimethoxysilyl)propyl]ethylenediamine | 1760-24-3 | Sigma |
| GLYMO | glycidoxypropyltrimethoxysilane | 2530-83-8 | Alfa Aesar |
| DMDES | dimethyldiethoxysilane | 78-62-6 | Alfa Aesar |
| MTEOS | methyltriethoxysilane | 2031-67-6 | Alfa Aesar |
| Basantol 311 | Cr/azo 1:2 in solution | | BASF |
| Basantol 099 | quinophthalone in solution | | BASF |
| Neozapon 975 | copper phthalocyanine + Cr/azo 1:1 | | BASF |
| Irgaperse | Cr/azo 1:2 in solution | | Ciba |
| Irgaperse 1641 | anthraquinone in solution | | Ciba |
| Orasol G | Co/azo 1:2 in solution | | Ciba |
| Orasol GN | phthalocyanine | | Ciba |

In all the examples, the reflective layer is a silver layer deposited according to the following procedure:
protection of the uncoated face with an acid-resistant adhesive film;
dilution of the silvering solutions (dilutable solutions supplied by the company DR.-ING. SCHMITT, GMBH Dieselstr. 16, 64807 Dieburg/GERMANY) according to:
42 µl of Miraflex®1200 in a 250 cm³ flask (sol No. 1)
125 µl of Miraflex® PD in a 250 cm³ flask (sol No. 2)
6 ml of Miraflex®RV in a 250 cm³ flask (sol No. 3)
6 ml of Miraflex®S in a 250 cm³ flask (sol No. 4)
placing a glass substrate in a tank into which the contents of solution No. 1 are poured (directly onto the glass);
stirring for 1 min then rinsing with distilled water;
placing the glass substrate in a second tank into which the contents of solution No. 2 are poured (directly onto the glass);
stirring for 1 min then rinsing with distilled water;
placing the glass substrate in a last tank into which (after starting the stopwatch) the contents of solutions No. 3 and 4 are poured (not directly onto the glass).
stirring for 30 seconds then rinsing with distilled water;
placing the glass substrate in the first tank and stirring for 1 min;
rinsing with distilled water.

The silver layer is then covered with an approximately 50 µm thick layer of alkyd-type paint of Fenzi brand, applied by spraying, followed by baking for 15 minutes at 180° C.

EXAMPLE 1 (COMPARATIVE)

A sol is prepared by mixing 11.565 g of Dowanol+0.6 g of DIAMO+1.062 g of gold chloride+57.84 g of Klucel+ 5.085 of TEOS.

It is deposited on a glass substrate having an area of 10×10 cm² by screen printing as a layer of 9 µm, then the coated substrate is baked at 600° C. and it is cooled rapidly in order to temper the substrate. A glass substrate partially coated with a layer of around 100 nm comprising an inorganic matrix of silica surrounding gold nanoparticles having a mean size of around 50 nm is thus obtained. The coloring layer contains 23% by weight of gold.

Haze measurements are carried out using the Haze-Gard Plus device from the company BYK Gardner. It is noted that this sample has a haze of around 10%.

EXAMPLES 2-4

A sol "A" is prepared by mixing 13.8 g of ethanol+5.4 g of 0.1 mol/L HCl+17.8 g of MTEOS stirring 2 h at ambient temperature+2 g of one of the following organic colorants:
Example 2: Basantol 311 (red),
Example 3: Basantol 099 (yellow),
Example 4: Irgaperse (blue).

The sol comprising the colorant is deposited by spin coating as a layer having a thickness of 2 µm. The coated substrate is then baked for 1 hour at 120° C. The coloring layer comprises a hybrid matrix. The coloring layer contains 25% by weight of colorant.

Haze measurements carried out under the same conditions as those of example 1 showed that these layers have a haze of around 1%.

The reflective layer made of silver is then applied directly. Mirrors having a reflected image that is colored are thus obtained. The color obtained corresponds to that of the colorant.

EXAMPLES 5-8

A colorant or mixture of colorants is mixed into a sol "B" of the hybrid silica/epoxy type comprising 23.25 g of GLYMO+8.275 g of 0.1 mol/L HCl+12.16 g of DMDES (stirring 1 h at ambient temperature).

The preparations according to the examples were:
Example 5: 3 g of Basantol 311 in 5 g of sol B+5 g isopropanol→red layer;
Example 6: 3 g of Basantol 099 in 5 g of sol B+5 g isopropanol→yellow layer;
Example 7: 3 g of Irgaperse 1641 in 5 g of sol B+5 g isopropanol→blue layer;
Example 8: 0.5 g of Neozapon 975+2 acetylacetone+7 g isopropanol+5 g sol B→green layer.

The sol comprising the colorant is deposited by spin coating as a layer having a thickness of 2 µm. The coated substrate is then baked for 1 hour at 120° C. The coloring layer contains 50% by weight of colorant for examples 5 to 7 and 14% by weight of colorant for example 8. The coloring layer is of hybrid type.

Haze measurements carried out on examples 5 to 8 showed a degree of haze of the order of 1%. The reflective layer made of silver is then applied directly. Mirrors having a reflected image that is colored are thus obtained. The color obtained corresponds to that of the coloring layer.

EXAMPLES 9-11

A colorant or mixture of colorants is mixed into a sol "C" of the zirconia type comprising 1.1 g of acetylacetone+19.34 g of isopropanol+3.57 of zirconium n-propoxide (stirring 2 h at ambient temperature).

The preparations according to the examples were;
Example 9: 0.5 g of Neozapon 975+1.1 g acetylacetone+ 1.5 g isopropanol+22.5 g of sol C→green layer;
Example 10: 0.5 g of Orasol G+1.1 g acetylacetone+1.5 g isopropanol+22.5 g of sol C→red layer;
Example 11: 0.5 g of Orasol GN+1.1 g acetylacetone+1.5 g isopropanol+22.5 g of sol C→blue layer.

The sol comprising the colorant is deposited by spin coating as a layer having a thickness of 2 µm. The coated substrate is then baked for 1 hour at 120° C. The coloring layer is of the inorganic zirconia type. The coloring layer contains 29% by weight of colorant.

Haze measurements carried out on examples 9 to 11 showed a degree of haze of around 1%.

The reflective layer made of silver is then applied directly. Mirrors having a reflected image that is colored are thus obtained. The color obtained corresponds to the color of the coloring layer.

EXAMPLE 12

A matrix based on acrylate resin is prepared by mixing 40 g of a V33E10010 hydroxylated acrylic resin sold by the company Fluidémail Empreinte Spécialités (polymer base), with 6 g of D95E10000 hardener sold by the company Fluidémail Empreinte Spécialités and 12 g of S01 E10080 diluent sold by the company Fluidémail Empreinte Spécialités. Added to this solution is 0.09 g of Orasol G colorant predissolved in 2 ml of an S01E10080 alcohol-containing solvent sold by the company Fluidémail Empreinte Spécialités. The mixture is stirred for 30 min then is deposited by spin coating as a layer having a thickness of 5 to 20 µm. The substrate thus coated is then dried for 1 hour at 100° C. The coloring layer is of acrylate organic type and contains 20% by weight of colorant.

A haze measurement carried out showed a degree of haze of less than 1%.

The reflective layer made of silver is then applied directly. A mirror having a reflected image that is colored is thus obtained.

EXAMPLE 13

A matrix based on a water-dilutable acrylate resin is prepared by mixing 20 g of an ES23N1 water-dilutable lacquer sold by the company Fluidémail Empreinte Spécialités, with 0.2 g of a 04069 hardener sold by the company Fluidémail Empreinte Spécialités and 1 g of water (diluent). Added to this solution is 0.09 g of Orasol G colorant predissolved in 2 ml of ethanol. The mixture is stirred for 30 min then is deposited by spin coating as a layer having a thickness of 5 to 20 µm. The substrate thus coated is then dried for 10 min at 200° C. The coloring layer is of acrylate organic type and contains 45% by weight of colorant.

A haze measurement carried out showed a degree of haze of less than 1%.

The reflective layer made of silver is then applied directly. A mirror having a reflected image that is colored is thus obtained.

EXAMPLE 14

Use is made of a matrix based on acrylate resin that can be polymerized under UV light by taking 20 g of a single-component product sold by Norland Products Inc. under the reference NOA81. A solution of colorant is prepared by dissolving 0.1 g of Orasol G colorant in 10 ml of isopropanol. 1.5 ml of this solution are added to the single-component product described previously. The mixture is stirred for 30 min then is deposited by spin coating as a layer having a thickness of 5 to 20 µm. The crosslinking is carried out under UV light for a duration of 10 min with an intensity of 35 mW/cm$^2$. The coloring layer is of acrylate organic type and contains 10% by weight of colorant.

A haze measurement carried out showed a degree of haze of less than 1%.

The reflective layer made of silver is then applied directly. A mirror having a reflected image that is colored is thus obtained.

The invention claimed is:

1. A colored mirror comprising a transparent substrate, a reflective layer, and a coloring layer between said substrate and said reflective layer, said coloring layer consisting of a matrix, which is inorganic or hybrid, comprising zirconia or titanium oxide and an organic colorant that is dissolved in the matrix so that the organic colorant is present in the matrix in a molecular state forming a solid solution with the matrix.

2. The mirror as claimed in claim 1, wherein the coloring layer has a thickness between 50 nm and 100 µm.

3. The mirror as claimed in claim 2, wherein the matrix is inorganic and has a thickness between 50 nm and 500 nm.

4. The mirror as claimed in claim 1, wherein the matrix is hybrid and has a thickness between 50 nm and 50 µm.

5. A process for preparing a mirror comprising a transparent substrate and a reflective layer, a coloring layer between said substrate and said reflective layer, said coloring layer consisting of a matrix, which is inorganic or hybrid, comprising zirconia or titanium oxide and an organic colorant that is dissolved in the matrix so that the organic colorant is present in the matrix in molecular form and forms a solid solution with the matrix, the process comprising producing the coloring layer on the substrate and depositing the reflective layer on the coloring layer.

6. The process as claimed in claim 5, wherein producing the coloring layer comprises spraying a liquid comprising an organometallic compound comprising condensable groups and a colorant.

7. The process as claimed in claim 6, wherein the organometallic compound is of the alkoxide type.

8. The process as claimed in claim 5, wherein the coloring layer is embossed in order to impart a texture thereto.

9. The process as claimed in claim 5, wherein the substrate undergoes a texturing operation before production of the coloring layer.

10. The process as claimed in claim 9, wherein the texturing operation is a sandblasting operation or an acid attack giving rise to a surface unevenness of the substrate.

11. The mirror as claimed in claim 4, wherein the thickness of the matrix is between 100 nm and 50 μm.

12. A colored mirror comprising a transparent substrate, a reflective layer, and a coloring layer between said substrate and said reflective layer, said coloring layer consisting of a hybrid matrix and an organic colorant that is dissolved in the hybrid matrix so that the organic colorant is present in the hybrid matrix in a molecular state and forms a solid solution with the hybrid matrix, wherein the hybrid matrix consists of a material that results from a hydrolysis/condensation of organosilanes R—Si(OR')$_3$ with R and R' being aryl or alkyl groups.

13. The mirror as claimed in claim 12, wherein R bears a polymerizable function.

14. The mirror as claimed in claim 13, wherein the polymerizable function is methacryloxypropyltrimethoxysilane or 3-glycidyloxypropyltrimethoxysilane.

* * * * *